(12) United States Patent
Wang et al.

(10) Patent No.: US 8,829,451 B2
(45) Date of Patent: Sep. 9, 2014

(54) HIGH EFFICIENCY SCINTILLATOR DETECTOR FOR CHARGED PARTICLE DETECTION

(75) Inventors: Zhibin Wang, Beijing (CN); Wei He, Beijing (CN); Fumin He, Beijing (CN)

(73) Assignee: Hermes Microvision, Inc., Hsinchu (TW)

( * ) Notice: Subject to any disclaimer, the term of this patent is extended or adjusted under 35 U.S.C. 154(b) by 157 days.

(21) Appl. No.: 13/495,102

(22) Filed: Jun. 13, 2012

(65) Prior Publication Data

US 2013/0334430 A1    Dec. 19, 2013

(51) Int. Cl.
*G01T 1/20* (2006.01)

(52) U.S. Cl.
CPC .................................. *G01T 1/2002* (2013.01)
USPC ......................................................... 250/368

(58) Field of Classification Search
USPC ......................................................... 250/368
See application file for complete search history.

(56) References Cited

U.S. PATENT DOCUMENTS

| | | | |
|---|---|---|---|
| 5,008,546 A * | 4/1991 | Mazziotta et al. | 250/366 |
| 5,241,180 A * | 8/1993 | Ishaque et al. | 250/361 R |
| 6,297,507 B1 * | 10/2001 | Chen et al. | 250/370.11 |
| 6,545,277 B1 * | 4/2003 | Kella et al. | 250/310 |
| 2002/0168317 A1 * | 11/2002 | Daighighian et al. | 424/1.11 |
| 2007/0096034 A1 * | 5/2007 | Juni | 250/370.11 |
| 2009/0266992 A1 * | 10/2009 | Beekman | 250/370.09 |
| 2013/0170792 A1 * | 7/2013 | Kim et al. | 385/39 |
| 2013/0234032 A1 * | 9/2013 | Wang et al. | 250/368 |

* cited by examiner

*Primary Examiner* — David Porta
*Assistant Examiner* — Taeho Jo
(74) *Attorney, Agent, or Firm* — WPAT, PC; Justin King

(57) ABSTRACT

An assembly for a charged particle detection device of high detection efficiency is described. The assembly comprising a metal grid for applying attractive potential to lure charged particles; a scintillator disc to absorb the energy from impinging charged particle and reemit the energy in form of light or photons; a light guide to transmit light or photons; and a photomultiplier tube (PMT) cohere with the end of light guide to receive light or photons from light guide and convert it into current signal. A light guide with a bullet-head-shaped front portion ensures total reflection of light propagating within the light guide. A frustum-cone-shaped scintillator disc releases the light that originally trapped in the scintillator disc due to the shape of scintillator.

9 Claims, 10 Drawing Sheets

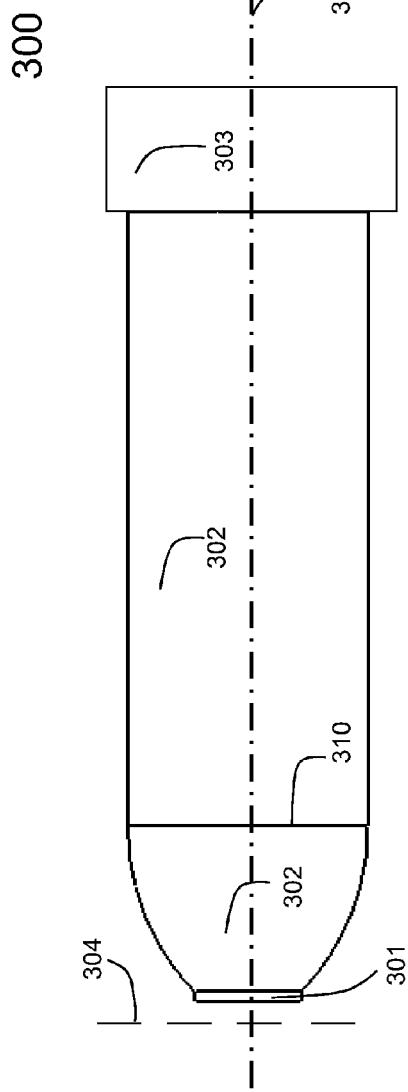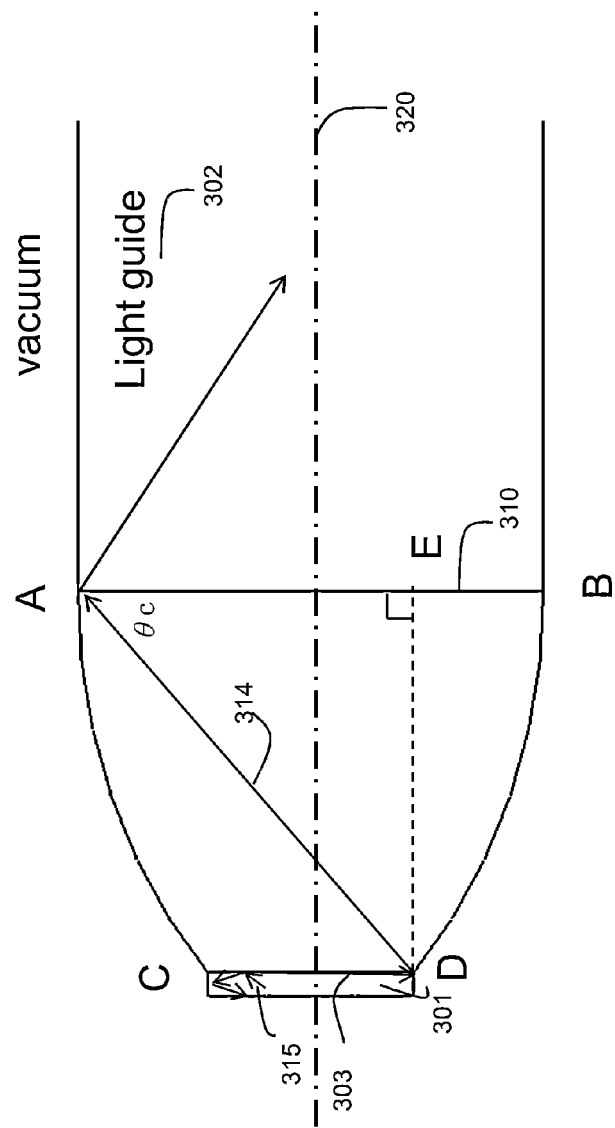
Figure 3A
Figure 3B simulation results

| | light guide shape | scintillator shape | assembly mode | efficiency |
|---|---|---|---|---|
| Prior Art | FIG.2 rod shape | Cylindrical disc | cohere | 25.23% |
| present invention | FIG.3 bullet-headed | Cylindrical disc | cohere | 39.16% |
| present invention | FIG.4 rod shape | frustum cone | cohere | 64.71% |
| present invention | FIG.5 bullet-headed | frustum cone | cohere | 78.83% |

Figure 6

| Conductive coating on side of Scintillator? | Reflective coating on bullet head portion of the light guide? | Reflective coating on rod shaped portion of the light guide? | Efficiency |
|---|---|---|---|
| No | No | No | 70.45% |
| Yes | No | No | 78.48% |
| Yes | Yes | No | 72.99% |
| Yes | Yes | Yes | 54.34% |

Figure 7

HIGH EFFICIENCY SCINTILLATOR DETECTOR FOR CHARGED PARTICLE DETECTION

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

FIELD OF THE INVENTION

The present invention relates to a charged particle detection device, more specifically, to a detection device that detecting the secondary electrons or secondary charged particles emanating from substrate surface after being impinged by a charged particle beam.

BACKGROUND OF THE INVENTION

A charged particle detector is an indispensable part of a charged particle (ion or electron beam) instruments, for example, a scanning electron microscope (SEM). In a SEM, an electron beam emanated from an electron source is focused into a fine probe over a specimen surface and scanned by a deflection unit in a raster fashion; and signal electrons released from the specimen, including secondary electrons and back scattered electrons, are collected by charged particle detectors and the signal intensity is converted into the gray level of an image pixel corresponding to the location of the electron probe on the specimen surface. Scanning of the electron probe will then form a gray level mapping thus producing an image of the specimen surface.

There common used detectors in SEM are scintillator-photomultiplier tube (PMT) combination type (e.g. an Everhart-Thornley detector), semiconductor type, and microchannel plate type. The scintillator-PMT type, due to their high gain and low noise properties in respect to the semiconductor type and microchannel plate type, is more frequently used in a high resolution and low beam current SEM. Traditionally, this type of detector is consisting of a light guide, a scintillator disc is attached to the front face of the light guide, and the rare end of the light guide is coupled to a photomultiplier tube. Secondary electrons and backscattered electrons emit from sample surface impinged on scintillator disc and, in response, generate light signals. The light guide collects the light signal and directs it to PMT. In a conventional design, the electrons to light signal conversion efficiency and light signal collection are low. In order to compose an image with enough brightness and contrast, a large magnification PMT or magnifying circuit is needed, which will introduce a larger electric noise into the image. Since the electron to light conversion efficiency is depending on the chosen scintillator material, thereby, it is expected to improve efficiency of the light collection before the PMT.

FIG. 1 illustrates a typical SEM system with a prior art electron detection device that is positioned above objective lens. The SEM configure with an electron source 101, a gun lens 102, and objective lens 103. Primary electron beam 112 generate from electron source 101 moving along the optical axis 113 through the center hole of a detection device strike sample 104 surface. There are several positions to set the detection device to intercept signal electrons (backscattered and secondary electrons) emanating from the sample 104 surface. A detection device set as detector 111 is called through the lens detector for collecting electrons with higher kinetic energy such as backscattered electrons 105. A detection device set as detector 200 is called side detector for collecting electrons with lower kinetic energy such as secondary electrons 106. The side detector 200 comprises a metal grid 204, a scintillator disc 201, a light guide 202, and a PMT 203. The signal from PMT is then being processed to become an image of sample surface.

FIG. 2A is a schematic illustration of a cross-section along the center axis of a conventional charged particle detection device 200. The metal grid 204 usually contains 100V to 500V positive potential respect to the sample 104 surface. Secondary electrons 106 emanate from the specimen 204 surface are attracted by the potential applied on the metal grid 204 to the detection device. After passing the metal grid, the secondary electrons accelerate to the scintillator disc 201 due to a 5 kV to 15 kV positive potential that applied to the scintillator disc 201. The high speed secondary electrons bombard the scintillator disc 201 and generate photons (light). The photons generated in the scintillator disc 201 propagate through the light guide 202 and reach the PMT 203 then become a current signal. In this design, the center of the scintillator disc, the center of the PMT, and the center of the light guide are all aligned by the center axis 220.

A charged particle detective device as FIG. 2A can be used to detect both positive and negative charged particles. In order to detect negative charged particles, the metal grid 204, and the scintillator disc 201 are applied a positive potential to lure and to accelerate negative charged particles such as electrons. On the other hand, for detective positive charged particles, the metal grid 204, and the scintillator disc 201 are applied a negative potential to lure and to accelerate positive charged particles such as sputtered gallium ions and secondary ions in Focused Ion Beam (FIB) system.

The light receiving efficiency of a detection device is defined in the present invention that the intensity of light received at the end of a light guide per unit energy input to a scintillator disc. According to the definition, a conventional detection device with a design as FIG. 2A has a light receiving efficiency around 25% when the light guide is made of BK7 glass with 120 mm in length and the scintillator disc is made of CEYAG.

There were many scientists put their efforts on collecting charge particles and signal electrons in different environment, but seldom discussion on the light ray receiving efficiency of the detection device. U.S. Pat. No. 4,900,932 by Schafer et al., disclosed a cathodoluminescence detector which includes an elliptical hollow mirror and a tube having a reflecting inner surface for conducting the light emitted by a specimen under investigation in a scanning electron microscope. The invention is collect and conducts the light emitted by specimen instead of from a scintillator. U.S. Pat. No. 6,069,356 by Todokoro, described the secondary electrons collecting mechanism in the scanning electron microscope application. U.S. Pat. No. 6,943,352 by Hayn, disclosed an apparatus to detecting charged particles in a gaseous environment during imaging in a scanning electron microscope. U.S. Pat. No.

7,417,235 by Schon et al., disclose an apparatus can detecting secondary ions as well as secondary electrons and tertiary electrons. U.S. Pat. No. 7,462,839 by Ganuck et al., disclosed a detector for scanning electron microscopes which can be used under different pressure conditions in the specimen chamber. The detector is designed for detection of both electrons and light.

The present invention propose a new high light receiving efficiency detection device to detect charged particles. The high receiving efficiency is achieved through altering the shape of light guide and the shape of scintillator disc.

SUMMARY OF THE INVENTION

A detection device for detecting secondary electrons induced by impinging charged particle beam comprising a metal grid, a scintillator disc, a light guide, a thin metal tube and a PMT; wherein the scintillator disc is cohered with the light guide that has a bullet-head-shaped portion and the end of light guide is cohered with or is mechanically attached to the PMT. The center of the scintillator disc, the center of the PMT, and the center axis of the light guide are all aligned together. The advantages of the detection device are: 1. the bullet-head-shaped portion of the light guide can ensure total reflection of light within the light guide and improves light collection efficiency to 39.16% compare with 25.23% of a conventional type detector; 2. the frustum cone type scintillator disc itself improves light collection efficiency to 64.71% compare with 25.23% of a conventional type detector; 3. the frustum cone type scintillator disc and a bullet-head-shaped portion of the light guide together improves light collection efficiency to 78.83% compare with 25.23% of a conventional type detector; 4. no reflective coating on the light guide is needed.

In one embodiment the invention, the light collection efficiency is improved by shaping the surface of front portion of the light guide into a bullet head shape. The diameter of light guide is proportional to the diameter of scintillator disc, the preferred proportional factor to construct a total reflection bullet head portion is between 1.8 and 6.8. This design can insure all light rays propagating within the light guide will perform total reflection at all light guide/vacuum interface. The length of the bullet head portion is smaller than the diameter of the light guide.

In another embodiment the invention, further improvement of the light ray collection efficiency is achieved by shaping the scintillator disc into a frustum cone shape to release trapped light rays within the scintillator disc. A reflective coating applied on the side surface of the frustum cone shaped scintillator disc can reflect light ray toward light guide and enhance the light ray collection efficiency.

In yet another embodiment the invention, the light ray collection efficiency improvement is achieved by shaping the scintillator disc to a frustum cone type and shaping the front portion of the light guide into a bullet head shape. A reflective coating applied to the side surface of the frustum cone shaped scintillator disc can help the light ray collection efficiency; however, a reflective coating on the light guide surface is not necessary.

BRIEF DESCRIPTION OF THE DRAWINGS

The present invention will be readily understood by the following detailed description in conjunction with the accompanying drawings, wherein like reference numerals designate like structural elements, and in which:

FIG. 3A is a schematic illustration of a conventional scintillator disc coheres to a bullet-head-shaped light guide according to one embodiment of present invention.

FIG. 3B is a schematic illustration of light ray path analysis within a conventional scintillator disc and a bullet-head-shaped light guide according to one embodiment of present invention.

FIG. 6 illustrates the simulation result of light ray collection efficiency of a charged particle detection device with different scintillator disc shapes and light guide shapes design.

FIG. 7 illustrates the simulation result of light ray collection efficiency regard to reflective coating applied on a charged particle detection device which has a frustum-cone-shaped scintillator disc cohere with a bullet-head-shaped light guide design.

DETAILED DESCRIPTION OF THE INVENTION

Figure 1:
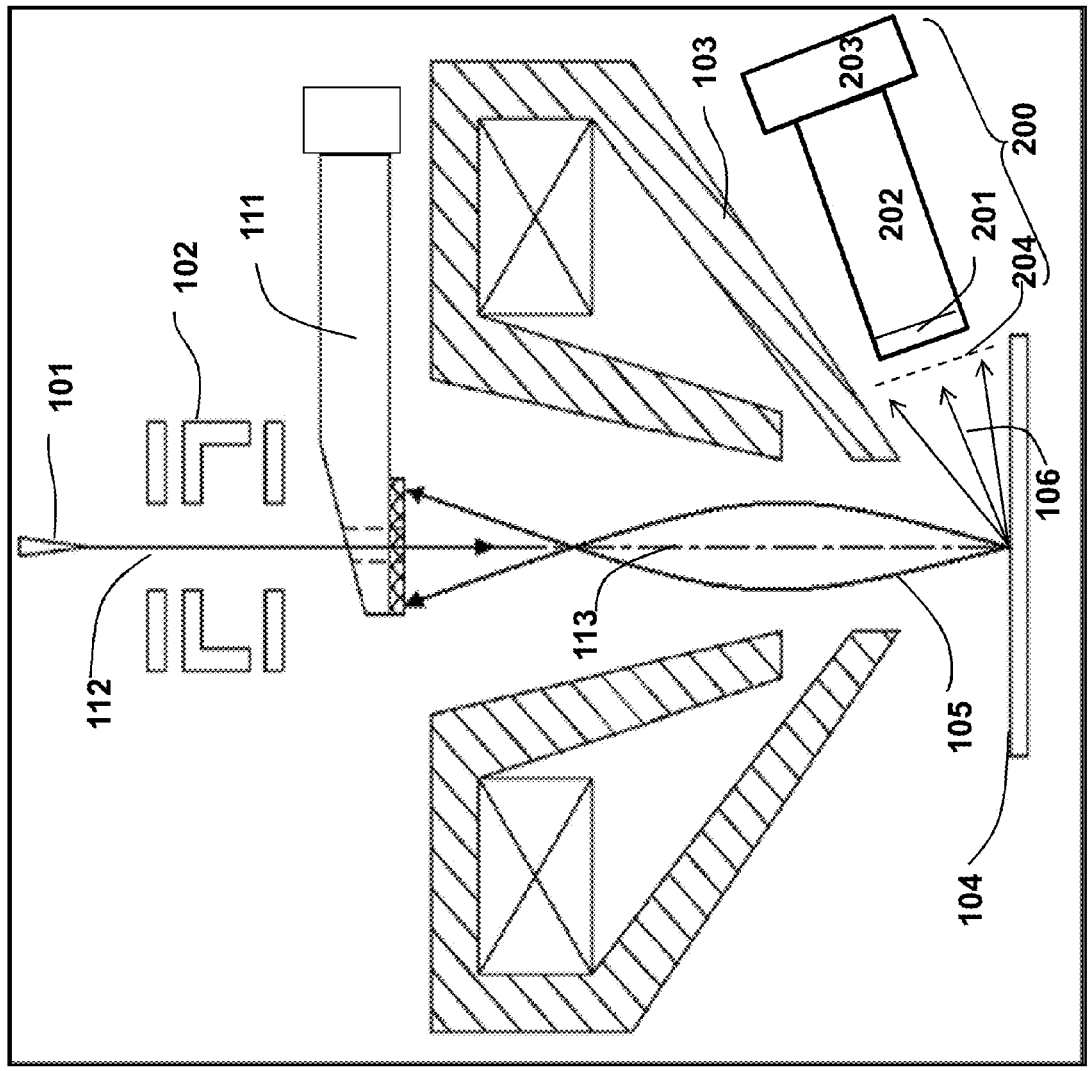
FIG. 1 is a schematic illustration of a typical SEM system with a prior art electron detection device that is positioned above and beside the objective lens.

Various example embodiments of the present invention will now be described more fully with reference to the accompany drawings in which some example embodiments of the invention are shown. Without limiting the scope of the protection of the present invention, all the description and drawings of the embodiments will exemplarily be referred to an electron source and scanning electron microscope. However, the embodiments are not be used to limit the present invention to specific charged particle sources and specific electron microscope field.

The descriptions below will focus on using electron beam, which is a kind of charged particles. In the drawings, relative dimensions of each component and among every component may be exaggerated for clarity. Within the following description of the drawings the same reference numbers refer to the same components or entities, and only the differences with respect to the individual embodiments are described.

A scintillator is a special material, which exhibits scintillation—the property of luminescence when excited by ionizing radiation. Luminescent materials, when struck by an incoming particle, absorb its energy and scintillate, i.e., reemit the absorbed energy in the form of light.

Photons will lose part of its energy when crossing the boundary from one medium to another due to reflection at the boundary (Fresnel Loss). Only when the photon has a reflection angle greater than the critical angle of reflection of the boundary can perform total reflection without transmission to another medium and without energy loss. For example, the Fresnel Loss between air and most plastics and glass (all of which has a refractive index around 1.5) is about 4% at each cross; the critical angle of reflection between air and most plastics and glass is approximately 42°.

Total reflection is an optical phenomenon that happens when a ray of light strikes a medium boundary at an angle larger than or equal to a particular critical angle with respect to the normal to the surface. If the refractive index is lower on the other side of the boundary and the incident angle is greater than the critical angle, no light can pass through and all of the light is reflected. When light crosses a boundary between materials with different kinds of refractive indices, the light beam will be partially refracted at the boundary surface, and partially reflected. However, if the angle of incidence is greater (i.e. the ray is closer to being parallel to the boundary) than the critical angle—the angle of incidence at which light is refracted such that it travels along the boundary—then the light will stop crossing the boundary altogether and instead be totally reflected back internally. This can only occur where light travels from a medium with a higher ($n_1$=higher refractive index) to one with a lower refractive index ($n_2$=lower refractive index). For example, it will occur when passing from glass to air, but not when passing from air to glass.

Since the refractive index of a scintillator disc is different and usually larger than the refractive index of a light guide, total reflection will occur on the scintillator/light guide interface. Refer to the FIG. 2B, the two horizontal lines are the boundary of the scintillator disc 201; If we assume that the light emission point 250 locates at the center of the scintillator disc; θc 252 is the critical angle of total reflection between the scintillator disc 201 and the light guide 202 interface which is the angle between the line 254 and the normal line 256. All the light emit from the emission point 250 will be reflected back to the scintillator disc 201 at the boundary except those light within the cone formed by line 254 revolves around the normal line 256 such as ray 258. The shape of a conventional scintillator disc is round but usually be represent by a rectangular when illustrating in the form of cross-section that has vertical 90 degree angle between each interface as FIG. 2C indicates. Once the total reflection of a ray starts at the scintillator/light guide interface, the reflected ray will be trapped and gradually decayed in the scintillator disc because the ray will perform total reflection at front and back interfaces and perform refraction and reflection at the side scintillator/vacuum interfaces. Here, the critical angle θc is dependent only on the refractive index of scintillator disc and light guide. The relation is that the larger difference between the two refractive index shows, the smaller the critical angle θc will be. Therefore, in order to have a better light transmitting efficiency from the scintillator disc to the light guide, the material of light guide should has a refractive index as close to which of the scintillator disc as possible. In the present invention, for example, refractive index of the scintillator disc is 1.82 (CEYAG) and refractive index of the light guide is 1.52 (BK7 glass) therefore the critical angle Oc of the scintillator/light guide interface is approximately 57°.

Figure 2A:
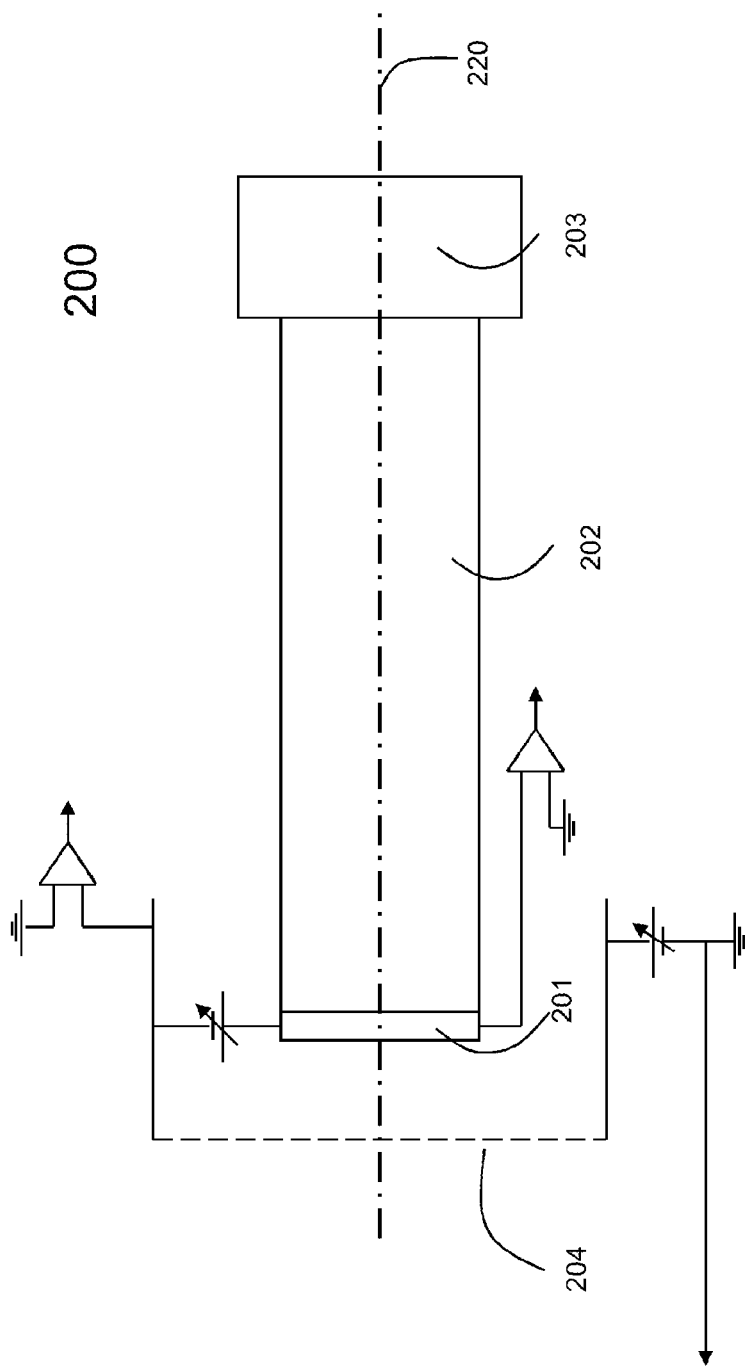
FIG. 2A a schematic illustration of a conventional charged particle detection device 200.
Figure 2B:
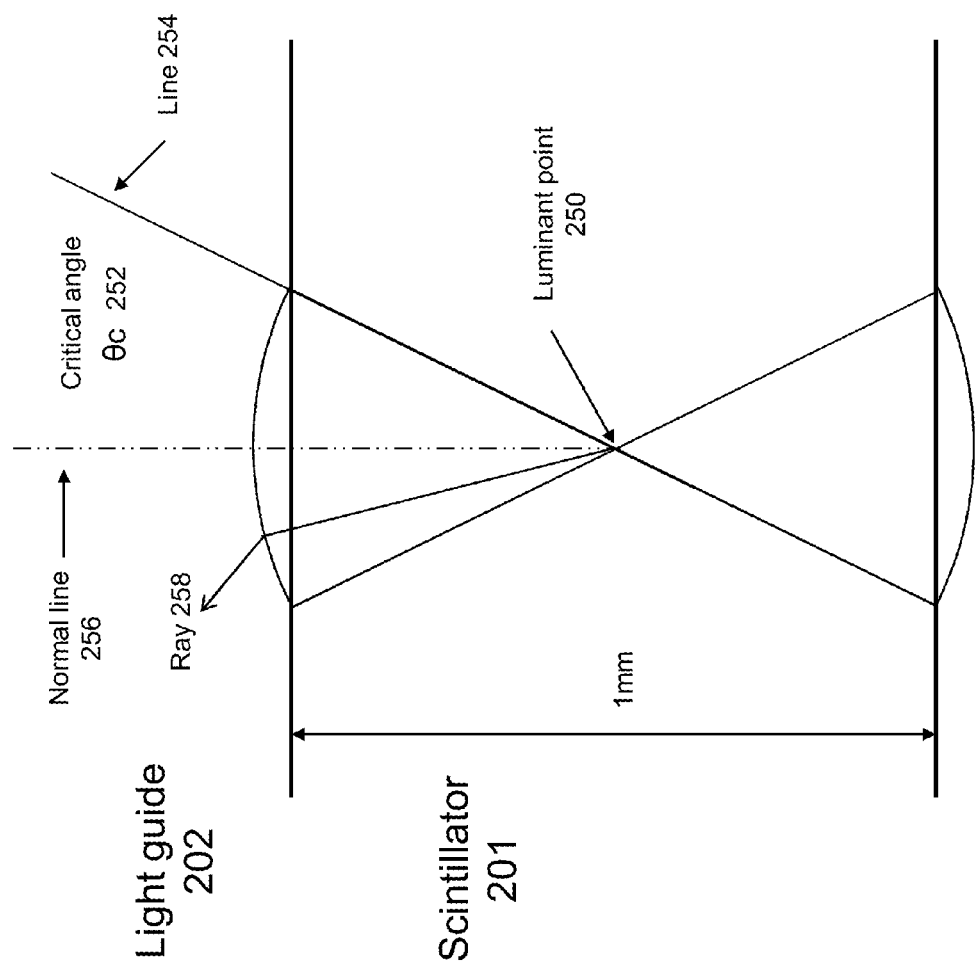
FIG. 2B a schematic illustration of a light ray analysis within a scintillator disc.
Figure 2C:
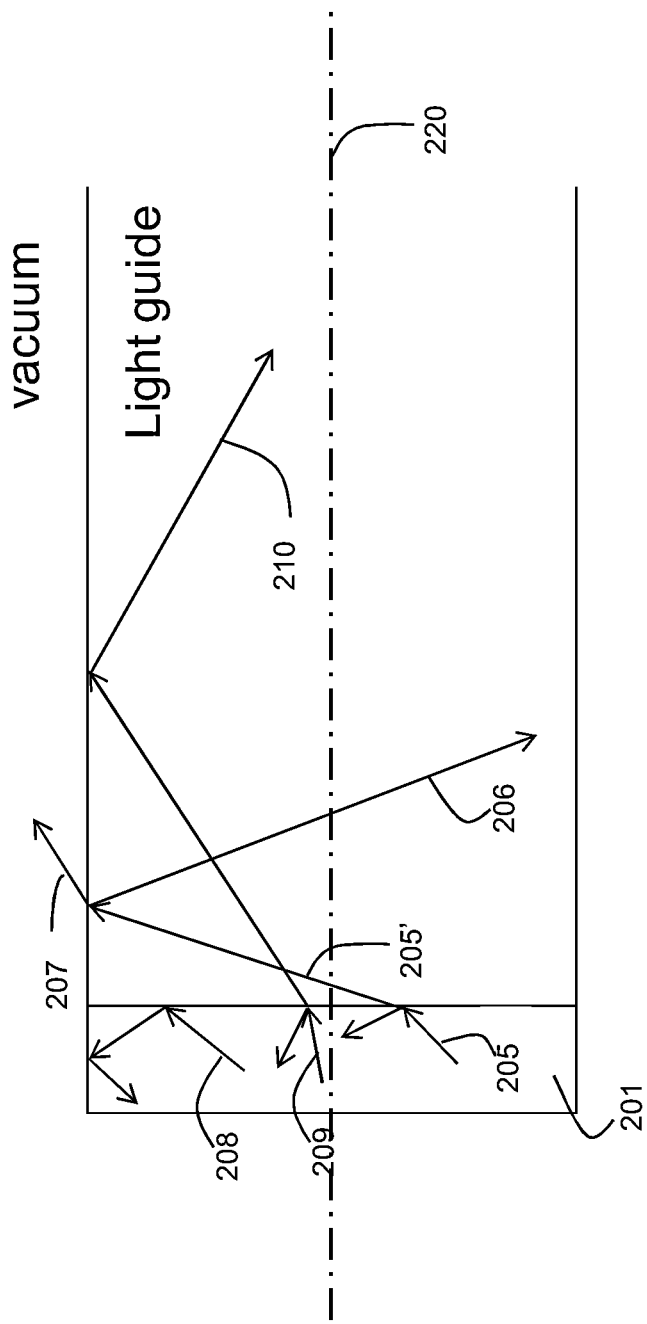
FIG. 2C is a schematic illustration of light ray path analysis within the scintillator and the light guide of FIG. 2A.

In FIG. 2C, ray 205 is produced in the scintillator disc 201, it represents a light ray beam to the scintillator/light guide interface with an incident angle smaller than the critical angle of scintillator/light guide interface. After refraction, however, the refracted ray 205' also has an incident angle to the light guide/ vacuum interface smaller than the critical angle of that interface. Fresnel Loss happens in the scintillator/light guide interface and the light guide/vacuum interface as the ray 205, ray 205', ray 206, and ray 207 indicates; only small portion of the ray 205 emitted from scintillator disc 201 may reach PMT 203. Ray 209 represents a light beam to the scintillator/light guide interface with an incident angle smaller than the critical angle of scintillator/light guide interface but after refraction has an incident angle larger than or equal to the critical angle of the light guide/vacuum interface. Fresnel Loss only happens at the scintillator/light guide interface but not at the light guide/vacuum interface as the ray 209 and ray 210 indicates; most of the ray 209 can propagate to PMT 203. Ray 208 represents a light beam to the scintillator/light guide interface with an incident angle larger than or equal to the critical angle of scintillator/light guide interface. No Fresnel Loss but total reflection happens at the scintillator/light guide interface. However, depend on incident angle of the Ray 208, Fresnel Loss or total reflection may happen at other scintillator/vacuum interface. Therefore, ray 208 will be trapped and gradually decayed in the scintillator disc and never reach PMT 203 through the light guide. The light intensity of the ray 208 will be gradually decreased and finally vanished due to Fresnel Loss to vacuum and self absorption as the ray travel within the scintillator disc.

The first embodiment of present invention is illustrated in FIGS. 3A and 3B. A charged particle detection device comprising: a metal grid 304, where a positive or negative potential is applied on to attract negative or positive charged particles to the detective device; a scintillator disc 301, where a positive or negative acceleration potential is applied on to accelerate the negative of positive charged particles and generate photons after high energy charged particles ram into the scintillator disc; a light guide 302, to conduct the ray or photons produce in the scintillator disc; and a PMT303, which collect and convert arrived light ray or photons to current signal. Wherein the scintillator disc 301 is cohered or mechanically attached to the light guide 302 and the front portion of the light guide 302 is shaped as a bullet head to insure all light ray or photons transmit into the light guide can perform total reflection at the light guide/vacuum interface. The center of the scintillator disc, the center of the PMT, and the center of the light guide are all aligned by the center axis 320. FIG. 3 is schematically illustrating a cross-section of the detective device along the center axis.

The light guide 302 is separated into a bullet-head-shaped portion and a rod portion by a vertical imagining plane 310, refer to the FIG. 3B. The plane 310 intercepts the light guide 302 at two places A and B. Line AB is parallel to the scintillator disc interface line CD. In order to receive a maximum light intensity at PMT 303 the ray travel within the light guide must perform total reflection at any light guide/vacuum interface during propagating, for example light ray 314 travel along the line AD and having a total reflection at point A. To insure this phenomenon, the light guide 302 must be reshaped such that all the ray refracted into the light guide from scintillator disc have an incident angle to the light guide/vacuum interface greater or equal to the critical angle of the interface. The incident angle to the interface of the ray 314 is the critical angle of the light guide/vacuum interface, which is about 41° in the present invention. If the length of line AD is a chosen radius which is the diameter of the rod portion of the light guide, and use point A as the center of circle to draw an arc BD from the scintillator disc to the rod portion, then shape the bullet-head portion of the light guide 302 by revolves the arc BD around the center axis 320 of the light guide 302. This will make the front portion of the light guide shape as a bullet head. With this light guide design, all the light ray emanate from the impact point of a charged particle to the scintillator disc 301 refract into light guide 302 at the interface as the ray 314 will reach PMT 303 without losing light intensity to reflection, only the light ray that reflect back to the scintillator disc 301 at the interface as the ray 315 indicates will be trapped and gradually decayed in the scintillator and not be detected by PMT 303.

The length of the bullet head portion of the light guide is shorter than the diameter of the light guide. Refer to FIG. 3B, the length of the bullet head portion can be represented by line DE which is equal to length AD multiple by sin θc, where θc is the critical angle of the light guide/vacuum interface. Since length AD is equal to the diameter of the light guide and sin θc is always less than one, the length of the bullet head portion is not longer than the diameter of the light guide. This light guide design can insure light ray perform total reflection at all light guide/vacuum or second media interface without losing light intensity or energy while propagating within the light guide by just reshape a small portion of the light guide into bullet head shape.

A thin layer of conductive coating is applied on the surface of scintillator disc 301 that receiving charged particles. The conductive coating provides a place to apply the acceleration potential for the incoming charged particles and prevent electrical charge accumulation on the scintillator disc. The thickness of the coating can not block out the charged particles into the scintillator disc. The side surface of the scintillator disc 301 is also coated but for reflection purpose. The surface that coheres to the light guide 302 is not coated. Another function of the conductive coating is to reflect the ray, that shooting to opposite directions during charged particle impact, forward to the scintillator/light guide interface as a mirror. Coating at the side surface can also prevent Fresnel Loss and prevent light ray refract into vacuum from the scintillator disc. One disadvantage of the conductive coating is that the coating also absorbs part of the light energy during reflection thus reducing light intensity after reflection. The conductive coating use in the present invention is aluminum. A preferred coating thickness on the scintillator disc is between 50 nm and 100 nm.

Figure 3C:
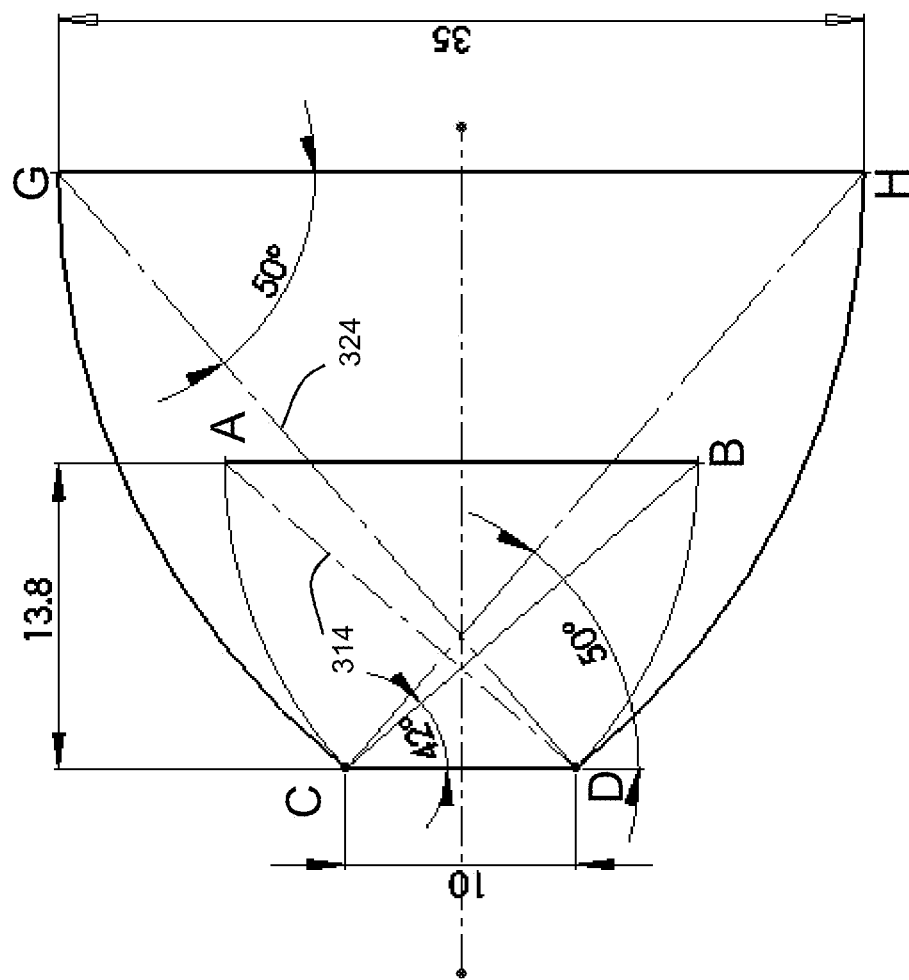
FIG. 3C is a schematic illustration of constructing a bullet-head-shaped light guide according to one embodiment of present invention.

FIG. 3C superimposes two bullet head shape together, one refers to 42° incident angle and the other refers to 50° incident angle. For a predetermined scintillator disc size, shaping the bullet head portion of the light guide according to the critical angle of the light guide/vacuum interface will give the detection device a thinnest total reflection light guide. The following embodiment of the present invention introduces a method to construct the bullet-head-shaped portion of a light guide based on any incident angle with a predetermined scintillator disc size.

Making a bullet head portion of light guide with an incident angle θ greater than the critical angel θc of light guide/vacuum interface is described as following. First, pick an incident angle, for example 50°. Draw a straight line as the ray 324 propagating direction with an incident angle of 50° from D point of the scintillator to point G of the vertical imaging boundary GH, where GH is parallel to the scintillator surface CD and the angle DGH is 50°. Take the length GD as radius, G as the center of circle, draw arc DH from the rod portion to the scintillator disc. Then shape the bullet-head portion of the light guide can be formed by revolves the arc DH around the center axis of the light guide. From the drawing, the diameter of light guide for based on 50° incident angle and the size of scintillator disc is determined For a 10 mm scintillator diameter, the diameter of light guide for 50° incident angle is calculated to be about 35 mm The diameter of light guide (rod portion) is proportional to the diameter of scintillator with a proportional factor $1/(2\cos\theta - 1)$, where θ is the incident angle of a ray beam to the light guide/vacuum interface. In practical, a preferred proportional factor is a number between 1.8 and 6.8 for a light guide with a bullet head portion.

Examine the two bullet head portion in FIG. 3C, for a same scintillator disc diameter, the bullet head based on critical angle has a smaller diameter (thinner) and shorter in length than other bullet head based on an angle larger than the critical angle. This implies that although both light guide design guaranty total reflection while light ray travels, the light ray propagating in light guide with a bullet head portion form from critical angle has better transmitting efficiency due to shorter traveling distance. More importantly, a thinner light guide may release more installation space and become a more compact device.

Figure 4:
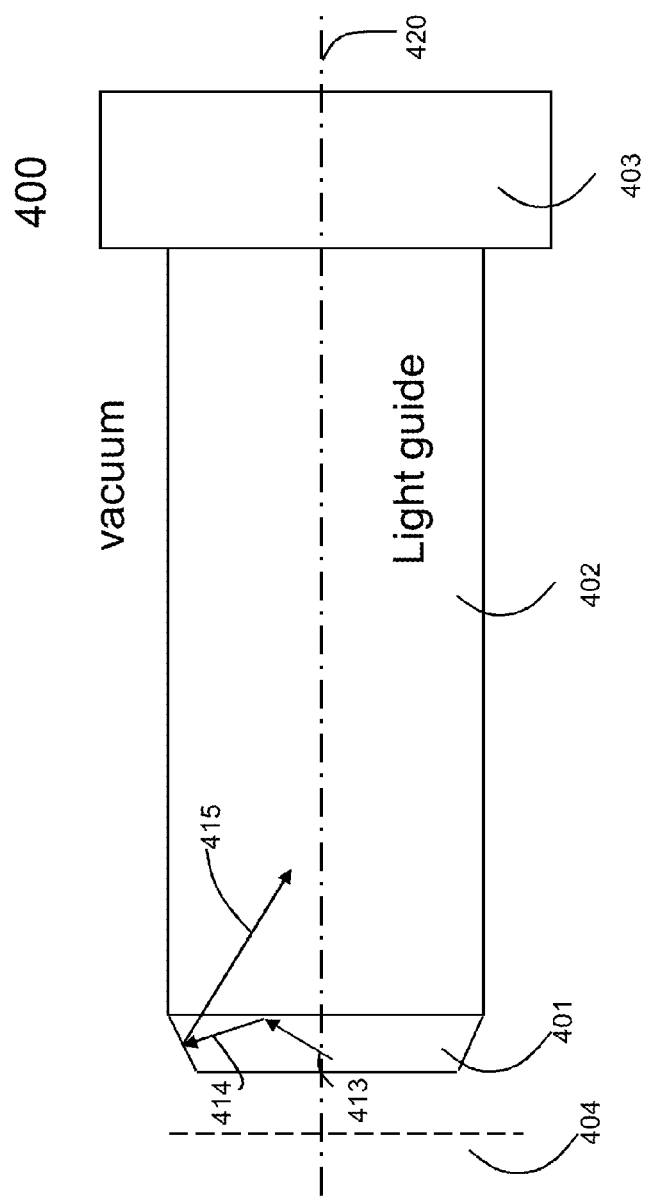
FIG. 4 is a schematic illustration of a frustum-cone-shaped scintillator disc coheres to a conventional light guide according to one embodiment of present invention.

One embodiment of the present invention to improve the light collection efficiency of a charged particle detection device by altering the shape of the scintillator disc to release trapped light ray is the illustrated in FIG. 4. A frustum-cone-shaped scintillator disc 401 is cohered or mechanically attached to a conventional rod-shaped light guide 402. The detection device also contains a metal grid 404, where a positive or negative potential is applied on to attract negative or positive charged particles. The center of the scintillator disc, the center of the PMT, and the center of the light guide are all aligned by the center axis 420. FIG. 4 is schematically illustrating a cross-section of the detective device along the center axis. The diameter of the frustum-cone-shaped scintillator disc (large side) is equal to the diameter of the light guide.

As previous discussed in FIG. 3B with a conventional cylindrical shaped scintillator disc, quite amount of light ray or photons emanate from the impact point of a charged particle inside the scintillator disc are trapped because the light perform total reflection on the scintillator/vacuum interface (ray 315). The conductive coating on the scintillator surface that reflect light ray at the side scintillator/vacuum interface does not release light ray to light guide. The present invention alters the edge of the scintillator disc to a non-vertical slant edge and makes the shape of the scintillator disc 401 from conventional cylindrical shape to frustum cone shape. The lower base of the frustum cone is cohered to the light guide. The slant edge alters the incident angle of ray 414 to the scintillator/vacuum interface and part of the ray will refract into vacuum and part of the ray will reflect back toward scintillator/light guide interface. If the slant angle of the frustum cone is consist with the critical angle of the scintillator/vacuum interface, all the ray had been reflected from the scintillator/light guide interface as ray 413 to 414 will reflect back at the scintillator/vacuum interface without loss and forward to light guide as the ray 414 to 415 indicates. This design can dramatically improve the light collection efficiency in PMT 403.

A thin layer of conductive coating is applied on the surface of scintillator disc 401 that receiving charged particles. The conductive coating provides a place to apply the acceleration potential for the incoming charged particles and prevent electrical charge accumulation on the scintillator disc. The thickness of the coating can not block out the charged particles into the scintillator disc. A conductive coating on the side surface of the frustum-cone-shaped scintillator prevents refraction and helps reflection at the interface. Since the conductive coating also function as a mirror, even the slant angle is not consist with the critical angle of the scintillator/vacuum interface, the conductive coating will reflect the ray toward the light guide with some energy loss due to absorption by the coating. The conductive coating use in the present invention is aluminum. A preferred coating thickness on the scintillator disc is between 50 nm and 100 nm.

Figure 5A:
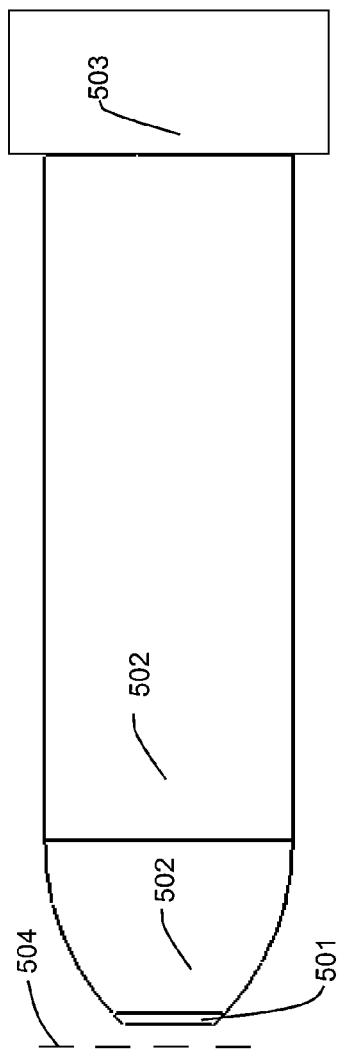
FIG. 5A is a schematic illustration of a frustum-cone-shaped scintillator disc coheres to a bullet-head-shaped light guide according to one embodiment of present invention.
Figure 5B:
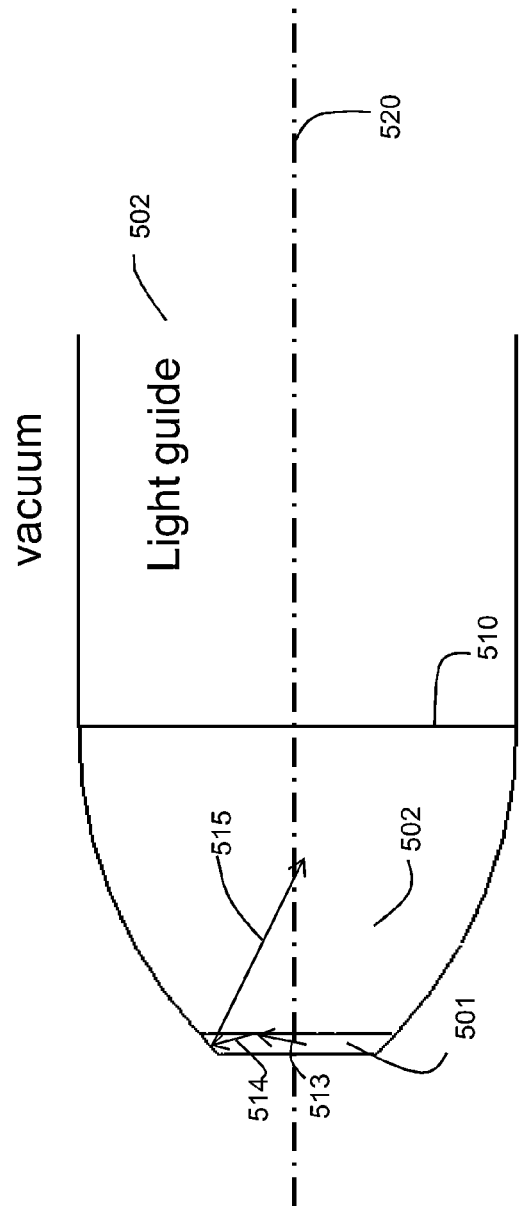
FIG. 5B is a schematic illustration of light ray path analysis within a frustum-cone-shaped scintillator disc and a bullet-head-shaped light guide according to one embodiment of present invention.

The other embodiment of the present invention further improved the light collection efficiency at PMT by combining frustum-cone-shaped scintillator disc and light guide with a bullet-head portion together. Refer to FIG. 5A and FIG. 5B, A charged particle detection device comprising: a metal grid 504, which a positive or negative potential is applied on to attract negative or positive charged particles to the detective device; a scintillator disc 501, where a positive or negative acceleration potential is applied on to accelerate the negative or positive charged particles and generate photons after high energy charged particles ram into the scintillator disc; a light guide 502, to conduct the ray or photons produce in the scintillator disc; and a PMT 503, which collect and convert arrived light ray or photons to current signal. Wherein a frustum-cone-shaped scintillator disc 501 is cohered or mechanically attached to the light guide 502 and the front portion of the light guide 502 is shaped as a bullet head to insure all light ray or photons into the light guide can perform total reflection at the light guide/vacuum interface. The center of the scintillator disc, the center of the PMT, and the center of the light guide are all aligned by the center axis 520. FIG. 5 is schematically illustrating a cross-section of the detective device along the center axis.

FIG. 6 compares a simulation result of light ray collection efficiency of a charged particles detection device with different scintillator disc shapes and light guide shapes. The calculation of the simulation is based on a scintillate material which has a refractive index of 1.82 (CEYAG), a transmittance of 80% per 10 mm and a light guide material which has a refractive index of 1.52 (BK7 glass), a transmittance of 99.7% per 10 mm. After introduce practical dimension of the scintillator disc and light guide and consider number of reflection during propagating, a frustum cone shaped scintillator disc and a rod shaped light guide design has a light collection efficiency of 64.71% (FIG. 4). A conventional cylindrical scintillator disc with a bullet-head shaped light guide has a light collection efficiency of 39.16% (FIG. 3). A frustum cone shaped scintillator disc combine with a bullet-head shaped light guide design has a light ray collection efficiency of 78.83% (FIG. 5). For comparison, the light ray collection efficiency of a conventional cylindrical scintillator disc with a rod shaped light guide is 25.23% (FIG. 2).

FIG. 7 illustrates the reflective coating effect to the light collection efficiency. A frustum cone shaped scintillator disc with a slant angle of 45° is cohered to a bullet head shaped light guide and PMT in series formation. The light ray collection efficiency is calculated at conditions that the reflective coating is applied to or not applied to the side of scintillator disc and light guide surface. The calculation is based on 1 mm thick CEYAG scintillator, 120 mm BK7 light guide in length. A reflective coating applied to the side surface of the scintillator disc helps the light ray collection efficiency by reflecting light rays back toward light guide. However, apply the reflective coating on the light guide surface does not improve the light ray collection efficiency at all. This is because the bullet-headed light guide design already insures a total reflection performance in all light guide/vacuum interface, therefore, a reflective coating is redundant to the detective device. On the contrary, the reflective coating will absorb a portion of light ray energy and reduce the ray intensity in each reflection during propagating to PMT and worsen the light ray collection efficiency.

The advantage of the present invention are the followings:
1. A frustum cone shaped scintillator disc with reflective coating on the side surface can release the trapped light rays and thereafter enhance light ray collection efficiency of the charged particle detection device. 2. A small bullet-head portion (shorter than light guide diameter) can insure the light ray propagating within the light guide perform total reflection at all light guide/vacuum interface and enhance light ray collection efficiency. The diameter of the light guide is proportional to the diameter of the scintillator and a preferred proportional factor is a number between 1.8 and 6.8. 3. A reflective coating on the light guide surface is not necessary and the manufacturing cost of the charged particle detection device is reduced.

What is claimed is:

1. A charged particle detection device comprising:
a metal grid for applying attractive potential to lure charged particles;
a scintillator disc to absorb the energy from impinging charged particle and reemit the energy in form of light or photons;
a light guide to transmit light or photons; and
a photomultiplier tube (PMT) cohere with the end of light guide to receive light or photons from light guide and convert it into current signal;
wherein the light guide is formed into a bullet-head-shaped front portion follow by a rod-shaped portion and the bullet-head-shaped front portion of the light guide is not longer than the diameter of the light guide.

2. The charged particle detection device of claim 1, wherein the side surface of the scintillator disc is coated with a reflective coating.

3. The charged particle detection device of claim 1, wherein the surface of the scintillator disc that endures charged particles impinging is coated with a conductive coating.

4. The charged particle detection device of claim 1, wherein the diameter of light guide is proportional to the diameter of scintillator disc with a proportional factor between 1.8 and 6.8.

5. A charged particle detection device comprising:
a metal grid for applying attractive potential to lure charged particles;
a scintillator disc with a frustum cone shape to absorb the energy from impinging charged particle and reemit the energy in form of light or photons;
a light guide to transmit light or photons; and
a photomultiplier tube (PMT) cohere with the end of light guide to receive light or photons from light guide and convert it into current signal;
wherein the light guide is formed into a bullet-head-shaped front portion follow by a rod-shaped portion and the bullet-head-shaped front portion of the light guide is not longer than the diameter of the light guide.

6. The charged particle detection device of claim 5, wherein the side surface of the scintillator disc is coated with a reflective coating.

7. The charged particle detection device of claim 5, wherein the surface of the scintillator disc that endures charged particles impinging is coated with a conductive coating.

8. The charged particle detection device of claim 5, wherein the diameter of light guide is proportional to the diameter of scintillator disc with a proportional factor between 1.8 and 6.8.

9. The charged particle detection device of claim 5, wherein the lower base of the frustum-cone-shaped scintillator disc is cohered to the light guide.

* * * * *